United States Patent
Eberler et al.

(10) Patent No.: US 7,501,826 B2
(45) Date of Patent: Mar. 10, 2009

(54) DIVIDING WALL SEPARATING THE RF ANTENNA FROM THE PATIENT CHAMBER IN AN MR SCANNER

(75) Inventors: Ludwig Eberler, Postbauer-Heng (DE); Wolfgang Renz, Erlangen (DE); Guenther Zebelein, Möhrendorf (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 11/845,833

(22) Filed: Aug. 28, 2007

(65) Prior Publication Data

US 2008/0054901 A1 Mar. 6, 2008

(30) Foreign Application Priority Data

Aug. 30, 2006 (DE) .................. 10 2006 040 574

(51) Int. Cl.
*G01V 3/00* (2006.01)
(52) U.S. Cl. .................................. 324/322; 324/318
(58) Field of Classification Search ......... 324/318–322; 600/410, 411
See application file for complete search history.

(56) References Cited

U.S. PATENT DOCUMENTS

| 5,235,283 | A | 8/1993 | Lehne et al. | 324/318 |
| 6,414,489 | B1* | 7/2002 | Dean et al. | 324/318 |
| 7,015,692 | B2* | 3/2006 | Clarke et al. | 324/300 |
| 2005/0030028 | A1* | 2/2005 | Clarke et al. | 324/318 |
| 2005/0035764 | A1* | 2/2005 | Mantone et al. | 324/318 |
| 2006/0269674 | A1 | 11/2006 | Schuster et al. | 427/256 |
| 2008/0054901 | A1* | 3/2008 | Eberler et al. | 324/318 |

FOREIGN PATENT DOCUMENTS

DE  103 15 539 A1  10/2004
DE  10 2004 024 618 A1  8/2005

* cited by examiner

*Primary Examiner*—Diego Gutierrez
*Assistant Examiner*—Tiffany A Fetzner
(74) *Attorney, Agent, or Firm*—Schiff Hardin LLP

(57) ABSTRACT

A dividing wall made from at least one first wall material for delimitation of a patient positioning region from an antenna structure of a magnetic resonance tomography apparatus has at least one region at which a specific sub-structure of the antenna structure is located on the side of the dividing wall facing away from the patient positioning region, at which the dividing wall has a wall part made from a second wall material with a dielectric constant that is lower than the dielectric constant of the first wall material.

20 Claims, 5 Drawing Sheets

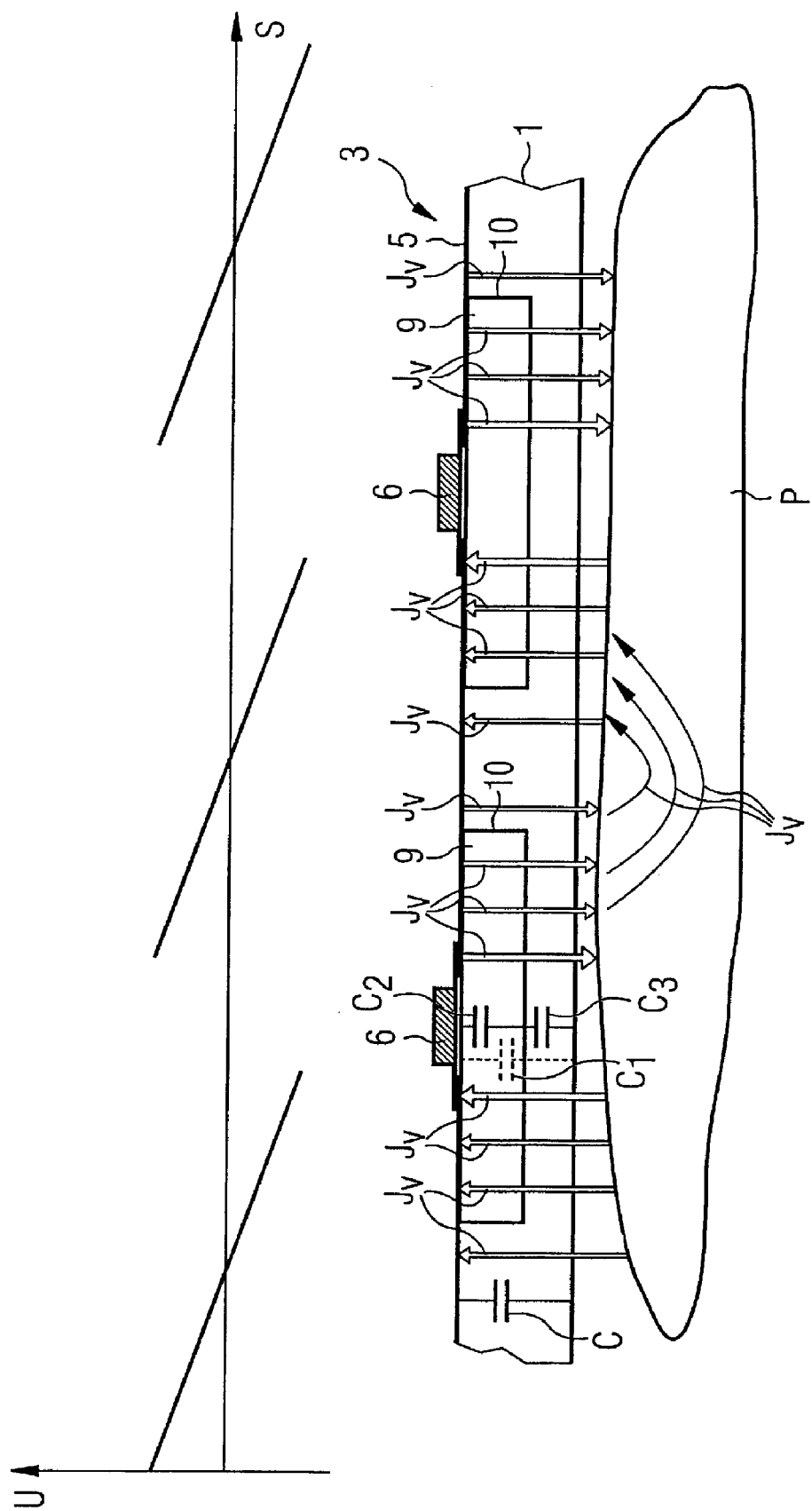

DIVIDING WALL SEPARATING THE RF ANTENNA FROM THE PATIENT CHAMBER IN AN MR SCANNER

BACKGROUND OF THE INVENTION

1. Field of the Invention

The invention concerns a dividing wall of the type made from at least one wall material for delimitation of a patient positioning region from an antenna structure of a magnetic resonance tomography apparatus. Moreover, the invention concerns a magnetic resonance tomography apparatus with such a dividing wall.

2. Description of the Prior Art

Magnetic resonance tomography is a widespread technique for acquisition of images of the inside of the body of a living examination subject. In order to acquire an image with this method, the body or a body part of the patient or subject to be examined must initially be exposed to an optimally homogeneous static basic magnetic field which is generated by a basic field magnet of the magnetic resonance system. During the acquisition of the magnetic resonance images, rapidly-switched gradient fields for spatial coding, which gradient fields are generated by gradient coils, are superimposed on this basic magnetic field. Moreover, radio-frequency pulses of a defined field strength are radiated into the examination subject with radio-frequency antennas. The nuclear spins of the atoms in the examination subject are excited by means of these radio-frequency pulses so that they are deflected from their equilibrium position (parallel to the basic magnetic field) by what is known as an "excitation flip angle". The nuclear spins then precess in the direction of the basic magnetic field. The magnetic resonance signals thereby generated are acquired by the radio-frequency acquisition antenna. The magnetic resonance images of the examination subject are ultimately generated on the basis of the acquired magnetic A typical magnetic resonance tomography apparatus comprises a patient positioning region (also called a patient chamber in the following) in which is located a patient bed on which the patient is positioned during the examination. For example, this can be what is known as a "patient tunnel" in a tube running through the housing of the scanner of the tomography apparatus. Moreover, there are also MR systems with a patient positioning region opening laterally that is enclosed in a U-shape by the housing of the MR scanner. Strong coils for generation of the permanent magnetic field are located within the housing of the scanner. Moreover, further coils for generation of the gradient fields are located within the housing.

Furthermore, the scanner typically has an antenna structure permanently installed in the housing, with which antenna structure the required radio-frequency pulses are emitted into the patient positioning region and with which excited magnetic resonance signals can be acquired. This radio-frequency antenna is also known as a "body coil". Moreover, coils known as "local coils" are additionally e/d in many magnetic resonance tomography systems. Such local coils can be placed directly on or below the regions of the body of the patient in whom magnetic resonance exposures are generated. These local coils can likewise be used both as a transmission antenna and as am acquisition antenna. In many examinations, however, the RF pulses are emitted from radio-frequency antennae integrated into the magnetic resonance examination scanner and the excited MR signals are received with the local coils.

An MR radio-frequency antenna is typically formed by a resonant antenna structure that includes inductances (for example a conductor structure) and various capacitances. In principle high potential jumps occur at the capacitances (which, for example, are formed by capacitors that couple the individual parts of the conductor structure with one another). The aforementioned radio-frequency antenna (the body coil) integrated into the magnetic resonance scanner itself is typically arranged directly on or near to the dividing wall described above. The dividing wall demarcates the patient chamber from the radio-frequency transmission antenna. This dividing wall normally simultaneously forms the inner wall of the housing of the magnetic resonance scanner that faces the patient space. In the case of a patient tunnel this dividing wall is, for example, the tube wall that lines the patient tunnel from the inside. Contact of the patient with the dividing wall therefore can lead to capacitive couplings of the electrical fields (E-fields) from the antenna into the body tissue of the patient, which can lead to high local SAR exposures (SAR=Specific Absorption Rate). Together with the body surface, the antenna structure thus forms a type of plate capacitor with the dividing wall as a dielectric therebetween.

In order to reduce or avoid the coupling of E-fields from the antenna into the body tissue as much as possible, it is sought by suitable positioning aids to avoid a direct contact by the patient. Alternatively, in some situations a larger radial separation of the antenna structure from the dividing wall makes the E-field coupling lower. This requires a greater structural height of the scanner, which leads to significantly higher costs.

SUMMARY OF THE INVENTION

An object of the present invention is to provide a dividing wall of the aforementioned type and a magnetic resonance tomography apparatus wherein coupling of E-fields into the body tissue upon contacting of the dividing wall by the patient is reduced in a simpler, safer and more cost-effective manner.

This object is achieved by a dividing wall according to the invention wherein, at least in a region at which a specific sub-structure of the antenna structure is located on the side of the dividing wall facing away from the patient positioning region, the dividing wall has a wall part made from a second wall material with a dielectric constant that is lower than the dielectric constant of the other wall material of the dividing wall.

As explained above, upon a contacting the dividing wall by the patient, the antenna structure, together with the body surface, forms a type of plate capacitor, with the dividing wall forming a dielectric between the antenna structure and the body surface. The size of the capacitance C linearly depends on the dielectric constant $\in$ of the material of the dividing wall, according to the following known equation $$C = \in_0 \cdot \in \cdot A/d \quad (1)$$

$\in_0 = 8.85 \ast 10^{-12}$ $CV^{-1}m^{-1}$ is the dielectric constant of free space, A is the area of the plate capacitor and d is the plate spacing, here the thickness of the dividing wall. As is shown later, the strength of the coupling of the E-fields into the tissue is directly proportional to the capacitance C.

Since the dividing wall at the patient chamber frequently also directly supports the RF antenna, it must be sufficiently stable as a supporting structure. The dividing wall also is executed as stably as possible for noise insulation (damping) reasons. For example, a tube made from glass fiber-reinforced plastic (also cited in the following with the typical abbreviation GFK) that exhibits a wall thickness of 8 to 10 mm is used for the dividing wall of a patient tunnel in a typical magnetic resonance apparatus. However, GFK or other suitable materials for manufacture of sufficiently stable dividing walls have a relatively high dielectric constant (for example $\varepsilon \approx 50$ applies for GFK) in a disadvantageous manner.

By the inventive use of the wall parts with the wall materials with a lower dielectric constant, in a simple manner, and without significant stability losses, the capacitance of the plate capacitor formed by the dividing wall between antenna structure and body tissue is decreased and thus the coupling of the electrical field is also automatically reduced in a simple manner. An increase of the distance between antenna structure and dividing wall is then no longer necessary. Special positioning aids in order to fix the patient in a position in which he or she can no longer contact the dividing wall can likewise be foregone.

In principle, the wall part can be fashioned from the second wall material with the lower dielectric constant such that the entire antenna structure is shielded by this as seen, for example, from the patient chamber. In many cases, particularly when a thinner (but nevertheless stable) dividing wall is provided and this dividing wall should additionally serve as a supporting structure for the antenna structure, the wall parts with the lower dielectric constant are preferably integrated into the dividing wall only in the region of such sub-structures of the antenna structure in which particularly high electrical fields occur.

In a preferred exemplary embodiment the dividing wall having the first wall material therefore exhibits a specific number of voids (for example openings or cavities (recesses)) in which the wall parts made from the second wall material are arranged or inserted. Cavities from a side of the wall facing away from the patient positioning region are preferably introduced into the wall as recesses, such that a continuous dividing wall surface remains on the side of the patient space. The introduction of such cavities and filling the cavities with the wall parts made from the second wall material also ensures that the dividing wall retains a particularly good stability. For this purpose, the wall parts made from the second wall material are advantageously adapted to the recess so that they entirely fill the recesses. However, in the case of dividing walls whose stability is not severely impaired by the recess, the wall parts can be inserted such that, for example, an air gap remains between the edge of the appertaining recess and the wall part, since the air in the remaining free spaces has the lowest possible dielectric constant of $\varepsilon=1$.

The voids can exhibit arbitrary shapes. For example, cartridge-like receptacles can be introduced in rectangular shape (in particular as squares) but also in honeycomb shapes or in another shape into the dividing wall are preferable with regard to the manufacturing process as well as with regard to the stability of the dividing wall. A relatively large area can be covered with such cartridge-like recesses, with a sufficient stability of the dividing wall being ensured by webs between the individual recesses.

As explained above, the dividing wall can exhibit a wide variety of shapes. In a preferred embodiment the dividing wall is fashioned as a tube in which the patient space is located in the form of a patient tunnel. In particular in such a case at least one portion of the dividing wall preferably forms a supporting structure for the antenna structure itself.

When the dividing wall is a tube for demarcation of a patient tunnel, the antenna structure can be fashioned as a birdcage structure, in particular as a high-pass birdcage. Such a birdcage structure is generally known. It has a number of conductive antenna rods running parallel to the tube axis, those antenna rods being respectively capacitively coupled among one another at the ends by ferrules. Such a structure is explained in detail below. Given use of such an antenna structure, the wall parts made from the second wall material are preferably arranged in the regions of the dividing wall at the side of the dividing wall facing away from the patient positioning region, at which, the ferrules of the birdcage structure are located The wall parts made from the second wall material are preferably arranged in such regions of the dividing wall at which capacitances of the antenna structure are located on the side of the dividing wall facing away from the patient positioning region. These capacitances are preferably shielded from the patient space over as large an area as possible by the appertaining wall parts. This is advantageous since particularly high field strengths are normally present directly at the capacitances of the antenna structure.

As described above, the patient positioning region is typically configured to accept a patient bed. Since the patient lies on the patient bed during the examination and therefore cannot unintentionally contact the dividing wall below the patient bed, it is sufficient for the wall parts made from the second wall material to be located only in the regions that are above the patient bed in the patient positioning region. By omitting the installation of addition wall parts below the patient bed, costs are saved and the stability of the dividing wall remains unchanged in this region. Provision of an upper region of the dividing wall (for example an upper segment of the tube wall situated opposite the patient bed in a patient tunnel) with wall parts with low dielectric constant can possibly even be omitted, since at that location as well, contacting by the patient is not very likely. Generally, contacting of the wall by the patient occurs in a short interval above the patient bed, such that the wall parts should primarily be applied in these regions of the dividing wall.

In principle all materials that are stable enough, non-conductive and non-magnetic can be used for the dividing wall itself. The dividing wall is advantageously composed substantially of GFK. For example, wound GFK tubes are frequently used to produce a dividing wall in the form of a patient tunnel. The glass fibers are wound on a tube and saturated with suitable resins. Relatively thin but nevertheless stable tubes can be produced. The voids in which the wall parts with the lower dielectric constant are then inserted can then be subsequently milled into the tube. Such tubes or dividing walls can also be cast in a vacuum from epoxy resin that is reinforced with glass fibers. Another possibility is the manufacture of such dividing walls from hard (laminated) paper, i.e. from paper which is, for example, saturated with epoxide or phenol resin or the like. Further, fiber-reinforced concrete tubes can be used, but these have the disadvantage of being relatively heavy.

For the second wall material a variety of materials can be used for manufacture of the wall parts with the lower dielectric constant. The second wall material should advantageously exhibit a dielectric constant of $\varepsilon \leq 2.0$. The dielectric constant is preferably $\varepsilon \leq 1.5$.

In order to achieve these values, a hard foamed material is advantageously used as the second wall material. Hard polyurethane foam are preferably be used for this, but a hard polymethacrylamide foam (hard PMI foam) that, for example, is also used as a core material in sandwich structures can likewise be used. This is characterized by excellent mechanical and thermal properties and, in comparison to other foamed materials, has an exceptional ratio of weight to mechanical properties as well as a high heat deformation resistance. A suitable hard PMI foam is available under the name ROHACELL® from the company Röhm.

The hard foamed material should advantageously exhibit a density of at maximum 200 kg/m³, preferably at maximum 150 kg/m³.

Alternatively, a material with a void structure (for example a honeycomb material or plastic parts which, for example, exhibit closed cover layers and ribs lying between them) can also be used as the second wall material insofar as the stability conditions allow this. Due to the large air enclosures in such wall materials it is ensured that the wall parts exhibit a particularly low dielectric constant.

An inventive dividing wall can be used in many types of magnetic resonance scanners in which (as is typical) the patient positioning region is divided from the antenna structure, independent of the shape that the appertaining dividing wall exhibits. Not only can the dividing wall or the tube wall in a magnetic resonance scanner with a patient tunnel be fashioned according to the invention, but also, the dividing walls in magnetic resonance scanners with U-shaped housing design with a laterally open patient space can be correspondingly equipped. The use of the invention is always reasonable insofar as antenna structures are located at positions on the side of the dividing wall facing away from the patient space, at which E-field coupling into the body of the patient can occur given a contacting of the dividing wall by the patient.

BRIEF DESCRIPTION OF THE DRAWINGS

FIG. 3b is an enlarged representation of the section Z from FIG. 3a.

FIG. 4 is a schematic cross-section through an (unrolled) segment of the inventive dividing wall of the patient tunnel according to FIGS. 3a and 3b.

DESCRIPTION OF THE PREFERRED EMBODIMENTS

Figure 1:
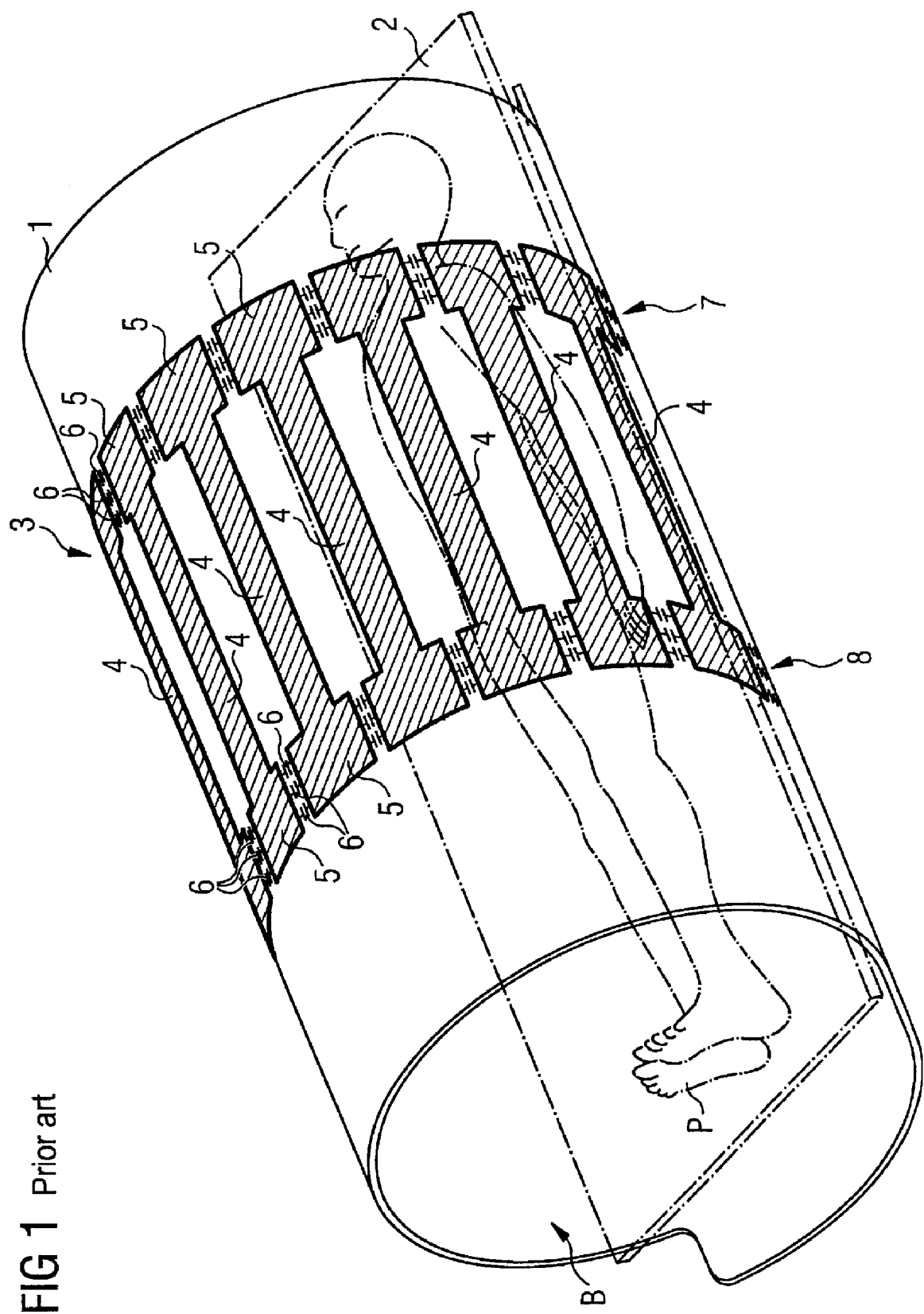
FIG. 1 is a basic representation of a patient tunnel according to the prior art with a birdcage antenna structure arranged thereon.

FIG. 1 shows a typical patient tunnel in a conventional magnetic resonance apparatus in which the dividing wall 1 is fashioned in the form of a tube. A patient bed 2 is arranged within this tube in a patient space B such that it can be displaced along the axis of the tube, on which patient bed 2 a patient P is positioned for examination. For this purpose the patient bed 2 can be backed out at the foot end and/or head end surface of the patient runnel. The patient is then positioned on the patient bed 2 outside of the patient tunnel and the patient bed with the patient is subsequently moved into the tunnel. The tube-shaped dividing wall 1 here is composed, for example, from 8 mm GFK, such as a wound GFK.

An antenna structure 3, for example in the form of conductor foils, plates or the like, is mounted on the outside the tube wall. Generally copper or another metal is used as a conductive material. The shown exemplary embodiment is a high-pass birdcage structure which comprises in total sixteen antenna rods 4 running parallel to the tube axis. The ends of the antenna rods 4 each have end segments 5 widening in a T-shape. The end segments 5 of two adjacent antenna rods 4 are connected via capacitors 6 (which are only schematically shown in FIG. 1) so that the end segments 5 respectively form ferrules 7, 8 of the birdcage antenna.

Suitable radio-frequency pulses are fed into the antenna structure 3 via matched feed lines so that the desired radio-frequency field forms inside the patient space B. These feed lines are not shown here for better clarity. The precise design of the patient tunnel, the patient bed, the antenna structure and the manner of the activation of the antenna structure and the further components necessary for this in a magnetic resonance tomography apparatus are sufficiently known to those skilled in the art so that no further explanation is necessary herein.

Figure 2:
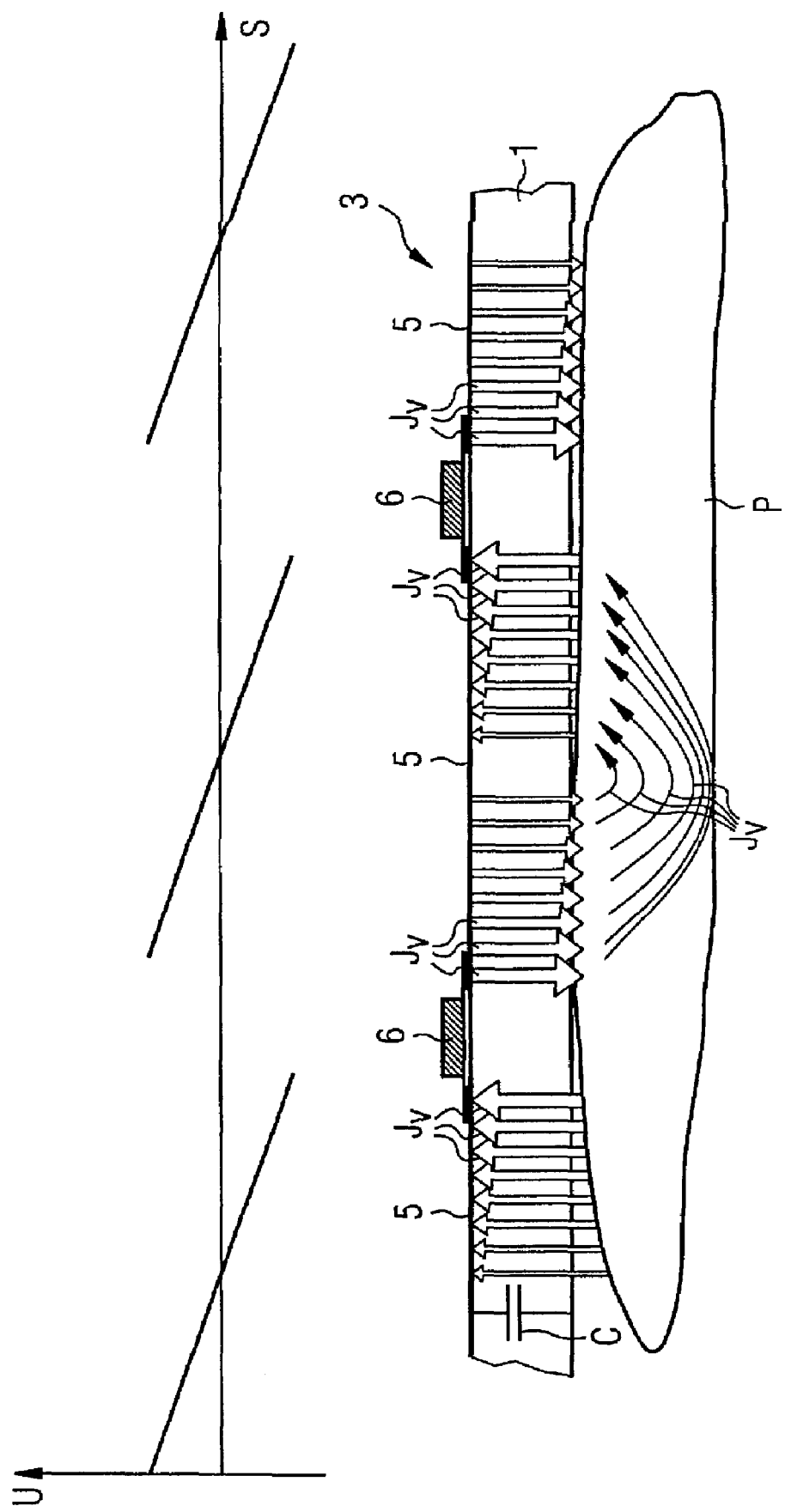
FIG. 2 is a schematic cross-section through an (unrolled) segment of the tube wall of the patient tunnel according to FIG. 1.

FIG. 2 shows a schematic cross-section through an unrolled segment of the tube wall 1 for explaining the coupling of electrical fields into the tissue of the patient P. A section along a ferrule 8 of the birdcage structure 3 is shown. As can be seen in FIG. 2, the conductive end segments 5 of the conductor rods 4 of the antenna structure 3, which are coupled among one another via capacitors 6, are located on the outside of the dividing wall 1. SMD capacitors 6 are shown in FIG. 2 that are respectively soldered on both sides to the adjacent ferrules 4 of the antenna rods 4.

Schematically shown directly above this representation in Figure is the voltage U applied to the antenna structure 3 upon emission of an RF pulse across the circumference S along the tube-shaped dividing wall 1. It can be seen that particularly high voltages occur directly to the right and left of the capacitors 6, in contrast to which a zero crossing exists between two adjacent capacitors 6 in the middle of the end segments 5. This means that the voltage in the middle region between the capacitors 6 is negligible. If a patient P now directly contacts the inside of the tube wall 1, the electrical field is coupled from the antenna structure 3 into the tissue of the patient P, meaning that displacement currents through the dividing wall 1 into the tissue of the patient occur, with the magnitude of the displacement current resulting from the current density and the area. The magnitude of the current density $J(\omega)$ generally is from $$J(\omega) = j\omega \cdot D \cdot A = j\omega \cdot C \cdot U, \quad (2)$$

wherein j designates the imaginary unit, $\omega$ the angular frequency, $D = \in_0 \in \cdot E$ the electrical flux density and A the area to be considered. According to equation (2), the current density $J(\omega)$ is consequently proportional to the dielectric constant $\in$ of the wall material and—since E=U/D applies—is simultaneously also proportional to the voltage U at the appertaining location. This leads to the situation that particularly high displacement currents occur at the locations at which a high voltage is applied to the antenna structure. This is schematically represented in FIG. 2 by the thickness and density of the arrows $J_V$.

As shown there, the displacement currents $J_V$ that propagate through the tube wall 1 into the tissue of the patient P close in the tissue and there lead to a tissue warming. The power introduced into the tissue is thereby proportional to the square of the flowing current. The SAR (Specific Absorption Rate) is defined as follows:

$$SAR = (\kappa/2\rho) \cdot |E|^2, \quad (3)$$

wherein $\kappa$ is the electrical conductivity of the tissue and $\rho$ is the tissue density.

The material GFK that is typically used for the conventional tube walls and dividing walls exhibits a dielectric constant of approximately $\in = 5$. If a wall thickness of 8 mm is assumed in the dividing wall 1 shown in FIGS. 1 and 2 and fashioned according to the prior art, a value of 0.55 pF/cm² results for the capacitance C of the plate capacitor thereby formed.

Figure 3A:
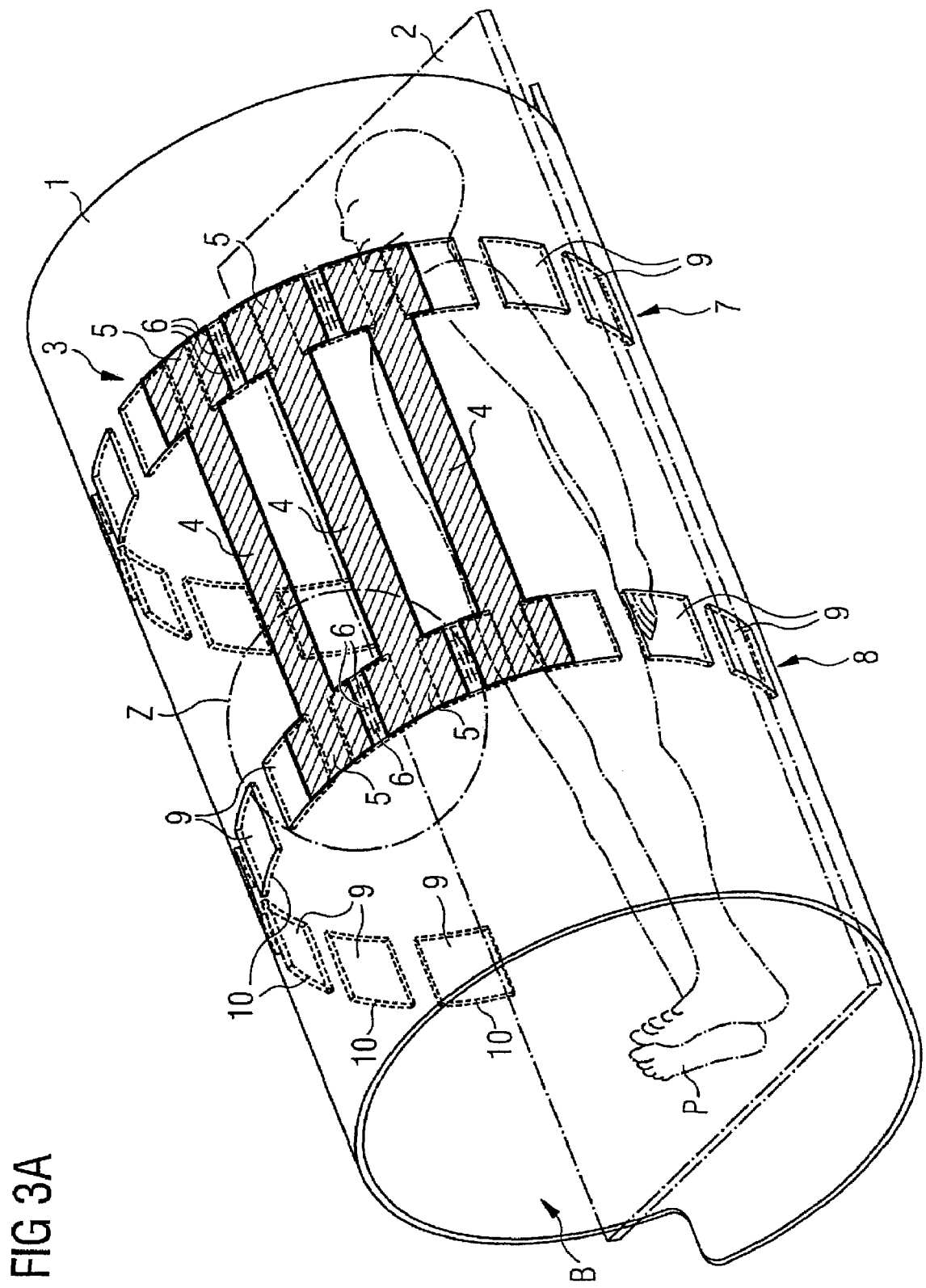
FIG. 3a is a basic representation of a patient tunnel with a birdcage antenna structure arranged thereon, with inventive wall parts in the region of the ferrules of the birdcage structure.
Figure 3B:
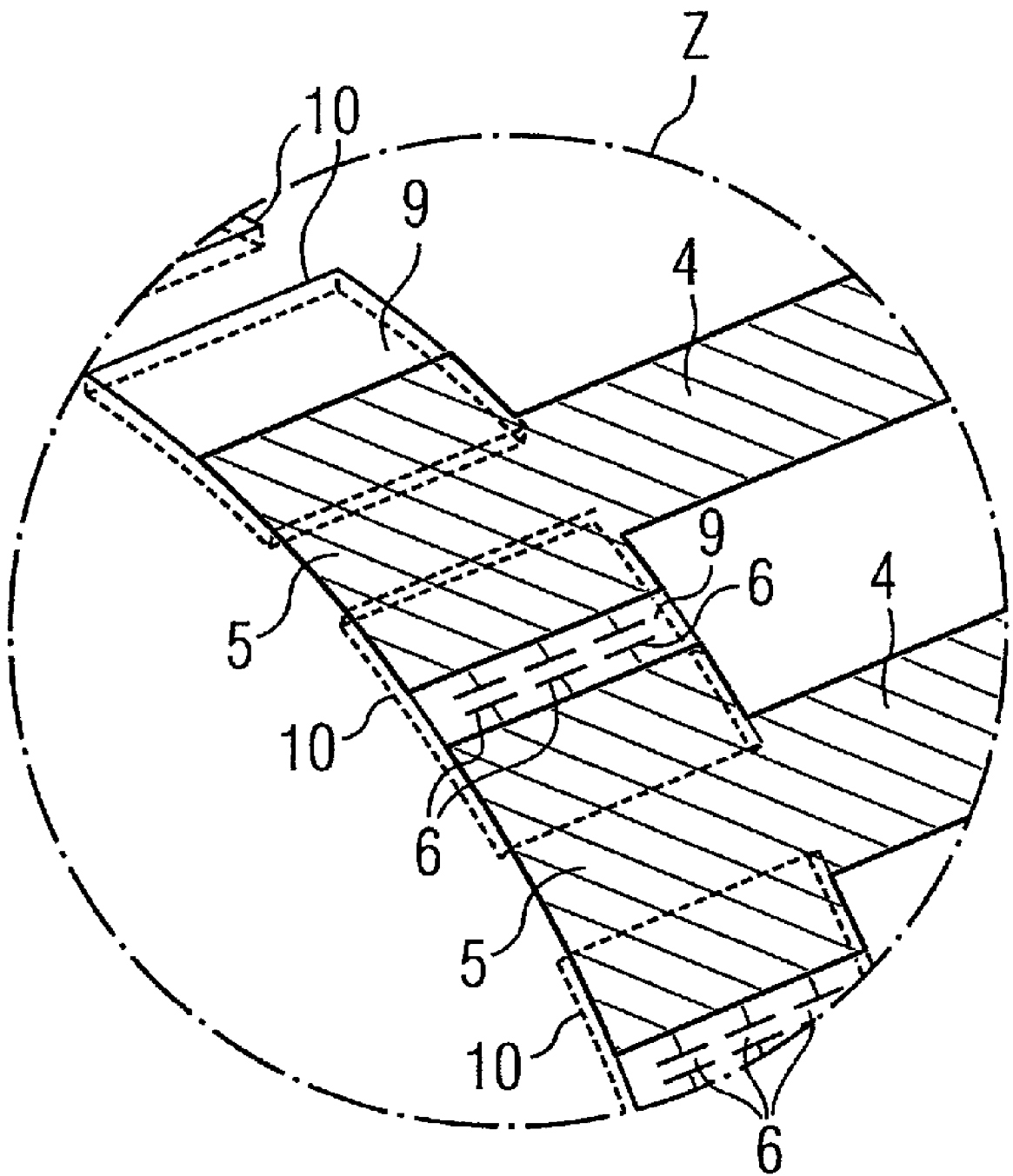

How the power introduced into the tissue of the patient P can be reduced simply in the inventive manner is shown in FIGS. 4a, 3b and 4. For this purpose, cartridge-like recesses 10 that are filled with wall parts 9 made from a material with a lower dielectric constant than the electricity constant of the remaining dividing wall material 1 are respectively introduced into the dividing wall 1 in the region of the ferrules 7, 8. These recesses 10 are situated such that they each relatively amply underlie precisely the border regions between the end segments 5 of two adjacent antenna rods 4, i.e. shield these from the patient space B. This is particularly well visible in the enlargement in FIG. 3b. For better clarity, only three antenna rods of the in total 16 antenna rods are shown in FIG. 3a. In principle, however, this antenna structure is fashioned in the same manner as in the exemplary embodiment according to the prior art according to FIG. 1.

As can be seen in FIG. 3a, there are thus two rings of nearly square, cartridge-like recesses 10 respectively under the head-end ferrule 7 and the foot-end ferrule 8 of the antenna structure 3. These cartridge-shaped rings [sic] are not entirely closed but rather extend only from the right upper edge of the patient bed 2 to the left upper edge, i.e. along an upper segment of the tube-shaped dividing wall 1. These recesses are foregone below the patient bed 2 since in this region a tube wall contact can be precluded. In this region the mechanical stability of the dividing wall 1 thus is entirely retained. The cartridge-like embodiment has the advantage that webs remain between the individual recesses 10 and thus the stability is only slightly reduced.

The effect of these recesses 10 filled with the wall parts 9 can be seen particularly well using FIG. 4 in comparison with FIG. 2.

As explained above by means of the equations (1) and (2), the electrical flux density and thus the magnitude of the displacement current depends on the capacitance of the plate capacitor formed by the dividing wall and thus in particular on its dielectric constant $\in$.

In the regions in which no wall parts 9 are located, i.e. in which the wall material of the dividing wall 1 exists in full thickness, as before the wall 1 forms a plate capacitor with the capacitance C=0.55 pF/cm² (with the values already described above, i.e. 8 mm wall thickness and GFK as a wall material).

However, in the regions in which the wall parts 9 are used the material layers situated atop one another can be considered as series circuits of two capacitances. The total capacitance can then be calculated in a typical manner according to the formula $$1/C_1 = 1/C_2 + 1/C_3, \quad (4)$$

wherein $C_1$ is the total capacitance of the dividing wall in this region, $C_2$ is the capacitance over the wall part 9 and $C_3$ is the capacitance over the remaining wall thickness of the initial material of the dividing wall 1 which remains between the recess 10 and the surface of the dividing wall 1 on the side of the patient space.

For the subsequent calculational example it is assumed that a 5 mm-thick hard foam plate with a dielectric constant $\in=1.1$ is used as a wall part 9. The remaining wall thickness of the GFK material is then 3 mm. With these values, according to equation (1) a capacitance $C_3$ of 0.195 pF/cm² results for the hard foam plate and a capacitance $C_2$ of 1.4 pF/cm² results for the remaining residual wall of the dividing wall 1. The total capacitance $C_1$ is then 0.17 pF/cm².

Using equation (1), an effective dielectric constant for the dividing wall 1 can be calculated from this in the region of the recesses filled with the wall parts 9. This effective dielectric constant results in $\in=1.56$ with the values cited above. This means that the capacitance or the dielectric constant was decreased by a factor of 3.2 in the regions of the wall parts 9 via the inventive measure. Since according to equation (2) the size of the displacement current is proportional to the capacitance, the displacement current is correspondingly decreased by a factor of 3.2 in this exemplary embodiment. Since, as explained above, the introduced power or the SAR is proportional to the square of the flowing current, this entails a SAR reduction by approximately a factor of 10.

It is not a problem that webs remain between the recesses with the wall parts 9, since these webs are located in a region of the zero crossing of the voltage U anyway and here only very low voltages are applied (as shown in the representation of the voltage U over the circumference S in the upper region of FIG. 4). In FIG. 4, the reduction of the displacement currents in relation to a design according to the prior art is also represented by the lower width and thickness of the arrows $J_V$ in comparison to FIG. 2.

The inventive arrangement ensures that, in critical regions with high E-fields, the dividing wall 1 is replaced by a material with smaller dielectric constant, whereby no impairment whatsoever of the mechanical stability of the dividing wall occurs due to the special design embodiment. The mass of the dividing wall likewise remains largely identically large. No only the bearing function but also the noise-damping properties are thus retained. Nevertheless, the danger of unacceptably high local SAR values is distinctly reduced via the invention. The entire design can additionally be produced in an extraordinarily cost-effective manner. Only one further work step is required in which corresponding recesses are initially introduced into the dividing wall after the manufacture and these are filled with the suitable wall parts (made, for example, from hard foam). Depending on the manufacturing process it is also possible to mold the recesses at the same time in the manufacturing of the dividing wall. The further assembly of the antenna structure on the dividing wall or at the dividing wall can be implemented in a conventional manner. The dividing wall itself can likewise also be treated further, for example surface-treated and mounted.

In conclusion it is noted again that the design of a patient tunnel described in detail in the preceding is only one exemplary embodiment which can be modified in the most varied manner by the average person skilled in the art without leaving the scope of the invention. The invention has been explained in the context of a magnetic resonance tomography apparatus used for medical applications, but it is not limited to such applications, and can also be utilized in scientific applications.

Although modifications and changes may be suggested by those skilled in the art, it is the intention of the inventors to embody within the patent warranted hereon all changes and modifications as reasonably and properly come within the scope of their contribution to the art.

We claim as our invention:

1. A dividing wall for separating a patient positioning region from a radio-frequency antenna structure in a magnetic resonance tomography scanner, comprising:

a wall structure configured to define a patient positioning region at a first side of the wall structure and configured to be substantially adjacent to a radio-frequency antenna structure at a second side of the wall structure, said radio-frequency antenna structure producing at least one region of high E-field strength said wall structure separating said patient positioning region from the antenna structure and being comprised of a first wall material having a dielectric constant; and said wall structure comprising a wall part that is located only next to a predetermined sub-structure of said antenna structure at which said region of high E-field strength is produced, said wall part being comprised of a second wall material having a dielectric constant that is lower than the dielectric constant of the first wall material.

2. A dividing wall as claimed in claim 1 wherein said wall structure comprises a plurality of voids, and wherein said wall part is disposed in said voids.

3. A dividing wall as claimed in claim 2 wherein said voids are formed as cavities in said second side of said wall structure.

4. A dividing wall as claimed in claim 2 wherein said wall part entirely fills each of said voids.

5. A dividing wall as claimed in claim 2 wherein said voids are formed as cartridge-like recesses in said wall structure.

6. A dividing wall as claimed in claim 1 wherein at least a portion of said wall structure is configured to form a structural support for said antenna structure.

7. A dividing wall as claimed in claim 1 wherein said wall structure forms a tube defining said patient positioning region.

8. A dividing wall as claimed in claim 1 configured to have a birdcage antenna structure, as said antenna structure, at said second side of said wall structure, said birdcage antenna structure having antenna rods having opposite ends electrically connected with each other by ferrules, and wherein said wall parts are disposed in regions of said wall structure at which said ferrules are located, at said second side of said wall structure.

9. A dividing wall as claimed in claim 1 wherein said wall parts are located in regions of said wall structure at which capacitances exist between said antenna structure and a patient in the patient positioning region.

10. A dividing wall as claimed in claim 1 wherein said wall structure defines a patient positioning region configured to accept a patient bed and wherein said wall part is located in said wall structure only above a location of the patient bed when in the patient positioning region.

11. A dividing wall as claimed in claim 1 wherein said wall part has a dielectric constant less than or equal to 2.0.

12. A dividing wall as claimed in claim 1 wherein said second wall material exhibits a dielectric constant less than or equal to 1.5.

13. A dividing wall as claimed in claim 1 wherein said wall structure is comprised of at least one material selected from the group consisting of glass fiber-reinforced plastic, resin-saturated paper material, and fiber-reinforced concrete.

14. A dividing wall as claimed in claim 13 wherein said second wall material is a hard foamed material.

15. A dividing wall as claimed in claim 11 wherein said second wall material is a hard foamed material.

16. A dividing wall as claimed in claim 15 wherein said hard foamed material is selected from the group consisting of hard polyurethane foam and hard polymethacrylamide foam.

17. A dividing wall as claimed in claim 15 wherein said hard foamed material has a maximum density of 200 kg/m$^3$.

18. A dividing wall as claimed in claim 15 wherein said hard foamed material has a maximum density of 150 kg/m$^3$.

19. A dividing wall as claimed in claim 1 wherein said second wall material is a material having a void structure.

20. A magnetic resonance tomography apparatus comprising:

a magnetic resonance scanner operable to obtain magnetic resonance data from a patient interacting with the scanner;

said scanner comprising a radio-frequency antenna structure that participates in the acquisition of said magnetic resonance data said radio-frequency antenna structure producing at least one region of high E-field strength; and said scanner comprising a dividing wall that separates a patient in the scanner from said antenna structure, said dividing wall comprising a wall structure that defines a patient positioning region in the scanner at a first side of the wall structure, with said antenna disposed at a second side of said wall structure, said wall structure being comprised of a first wall material having a dielectric constant, and said wall structure comprising a wall part, located only substantially adjacent to a predetermined sub-structure of said antenna structure at which said region of high E-field strength is produced, said wall part being comprised of a second wall material having a dielectric constant that is lower than the dielectric constant of the first wall material.

* * * * *